(12) United States Patent
Mayusumi et al.

(10) Patent No.: US 6,323,140 B1
(45) Date of Patent: Nov. 27, 2001

(54) METHOD OF MANUFACTURING SEMICONDUCTOR WAFER

(75) Inventors: Masanori Mayusumi; Masato Imai, both of Annaka; Kazutoshi Inoue, Maebashi; Shinji Nakahara, Takasaki, all of (JP)

(73) Assignee: Silicon Crystal Research Institute Corp., Annaka (JP)

( * ) Notice: Subject to any disclaimer, the term of this patent is extended or adjusted under 35 U.S.C. 154(b) by 0 days.

(21) Appl. No.: 09/646,718

(22) PCT Filed: Mar. 26, 1999

(86) PCT No.: PCT/JP99/01538

§ 371 Date: Feb. 26, 2001

§ 102(e) Date: Feb. 26, 2001

(87) PCT Pub. No.: WO99/50895

PCT Pub. Date: Oct. 7, 1999

(30) Foreign Application Priority Data

Mar. 27, 1998 (JP) .................................................. 10/098149

(51) Int. Cl.$^7$ ......................... H01L 21/31; H01L 21/469
(52) U.S. Cl. ......................... 438/787; 438/758; 438/778; 438/906
(58) Field of Search ..................................... 438/758, 778, 438/787, 906

(56) References Cited

U.S. PATENT DOCUMENTS

| | | | |
|---|---|---|---|
| 5,718,762 | 2/1998 | Habuka et al. ........................ | 117/97 |
| 6,143,629 | * 11/2000 | Sato ...................................... | 438/455 |
| 6,217,650 | * 4/2001 | Hirose et al. ........................... | 117/84 |
| 6,235,645 | * 5/2001 | Habuka et al. ........................ | 438/758 |

FOREIGN PATENT DOCUMENTS

| | | |
|---|---|---|
| 730048 A | 9/1996 | (EP) . |
| 59-162200 A | 9/1984 | (JP) . |
| 63-160324 A | 7/1988 | (JP) . |
| 8-236462 A | 9/1996 | (JP) . |

\* cited by examiner

*Primary Examiner*—Richard Elms
*Assistant Examiner*—Christian D. Wilson
(74) *Attorney, Agent, or Firm*—Frishauf, Holtz, Goodman, Langer & Chick, P.C.

(57) ABSTRACT

Disclosed is a method for manufacturing a semiconductor wafer having an epitxial layer on a surface thereof, by the steps of forming a pritective oxide film on a surface of a semiconductor wafer prior to loading of the wafer into an eptaxial growth furnace, removing the protective oxide film formed on the surface of the wafer by heating after the wafer is loaded in the furnace, and performing epitaxial growth of the epitaxial layer on the surface from which the protective oxide film is removed in the furnace. The protective oxide film is removed by heating the wafer in the furnace in an ambience of hydrogen gas at a pressure ranging from $0.0133 \times 10^5$ Pa to $1.013 \times 10^5$ Pa and at a temperature ranging from 800° C. to 1,000 ° C., or by heating the wafer in the furnace at a pressure of $5 \times 10^6$ Pa or under and at a temperature ranging from 800° C. to 1,000° C.

4 Claims, 6 Drawing Sheets

METHOD OF MANUFACTURING SEMICONDUCTOR WAFER

TECHNICAL FIELD

The present invention relates to a method for manufacturing a semiconductor wafer and more particularly to the method including the steps of forming a protective oxide film on the surface of a semiconductor wafer subjected to a final polishing and a final cleaning and then removing the protective oxide film, prior to the formation of an epitaxial growth layer on said surface.

BACKGROUND ART

In the case of the ordinary manufacturing and processing operation of semiconductor wafers, a silicon single crystal ingot is first cut to slices of a given thickness by a wire saw, ID saw or the like to produce wafer substrates. The surface of these wafer substrates have minutes irregularities caused by the slicing or these wafer substrates are not uniform in thickness so that they are lapped to flatten the surface irregularities and to make the work distortions uniform in depth thereby preparing them to have the uniform thickness.

After the lapping, a work strained layer is caused by these processing steps and particles such as minute metals and abrasive powder, silicon wastes, etc., are deposited on the work strained layer thus requiring to perform an etching by a chemical process using strong acid, fluoric acid or the like to remove these particles.

Following the etching process, the wafer substrates are subjected to a single side mirror polishing after the acids deposited on their surfaces have been neutralized by alkali, rinsed in clean water and dried. Usually, the mirror polishing includes two levels of polishing composed of a rough polishing and a final polishing and finally they are advanced to a final cleaning process after the improvement of the minute surface roughness or microroughness as well as the removal of haze have been effected.

The semiconductor wafer substrates thus having the highly cleaned surfaces as the result of the final cleaning are subjected to an epitaxial growth process for depositing and growing silicon single crystals on the surface of the substrates by, for example, a H-Si-Cl system CVD process.

However, there has been a problem that even if a highly clean surface is obtained by a final cleaning, there is the danger of the cleaned surface being contaminated or damaged to cause defects until the loading in the furnace in the epitaxial growth process. For example, if the silicon surface is directly contaminated with metal or organic matter after the clean surface has been produced by effecting a fluoric acid treatment (HF treatment) in the final cleaning step, there is the danger of causing the formation of a layer of chemical compound due to such contaminants. This chemical compound layer has a strong bonding strength and it is not easily removable. Also, it has been confirmed that the wafer surface subjected to the HF treatment becomes extremely active thus tending to cause redeposition of particles of organic material or the like.

As a result, methods which protect the clean surface of a wafer subjected to the final cleaning until the following process to prevent such contamination have recently been studied. For instance, Japanese Patent No. 2,540,690 published on Oct. 9, 1996 discloses that in order to protect the wafer surface from damage in the form of defects, contamination, etc., an oxide film having a film thickness of 50 to 200 angstrom (5 to 20 nm) is intentionally formed on the surface of a semiconductor wafer before its loading in an epitaxial growth furnace and the formation of an epitaxial growth layer is performed after the oxide film has been removed in an ambience of HCI gas at 1,200° C. in the furnace after the loading.

However, this conventional method gives rise to the following problem due to the removal of the oxide film by the high temperature HCI gas etching. More specifically, due to the fact that the reaction rate of HCI with Si is higher than its reaction rate with $SiO_2$, even if a very small film thickness variation exists partly in the oxide film, as the HCI etching proceeds, minutes irregularities are caused resulting in surface roughness and this surface roughness causes crystal defects in the following epitaxial growth process.

On the other hand, while it has been known that such surface roughness due to HCI becomes increasingly eminent with decrease in the etching temperature, the recent tendency is toward performing the epitaxial growth at a relatively low temperature of about 1,000° C. by using, for example, monosilane ($SiH_4$) for the silicon source gas and therefore any attempt to avoid the labor of heating the interior of the epitaxial growth furnace to a higher temperature has the converse effect of making the problem of surface roughness unavoidable. Further, in the case of epitaxial growth at such low temperatures, such problems as the back contamination from HCI and the contamination due to any equipment corrosion by HCI cannot also be disregarded.

It will be seen from the forgoing that there has heretofore been established no method capable of satisfactorily producing a highly clean wafer surface without causing the occurrence of surface roughness and any new and additional contamination after the removal of an oxidation preventive film.

In view of the foregoing deficiencies, it is an object of the present invention to provide a method for manufacturing a semiconductor wafer capable of removing a protective oxide film in such a manner that the occurrence of surface roughness and contamination is reduced than previously thereby producing a highly clean wafer surface.

DISCLOSURE OF THE INVENTION

According to one aspect of the present invention, the above-mentioned object can be accomplished by a method for manufacturing a semiconductor wafer having an epitaxial layer on a surface thereof, said method comprising the steps of forming a protective oxide film on a surface of a semiconductor wafer prior to loading of said wafer into an eptaxial growth furnace, removing said oxide film formed on said surface of said wafer by heating after said wafer is loaded in said furnace, and performing epitaxial growth of said epitaxial layer on said surface from which said oxide film is removed in said furnace, wherein said step of forming said protective oxide film comprises forming a silicon dioxide film on said surface of the wafer by using a solution of oxidizing agent, and wherein said step of removing said oxide film comprises heating said wafer within said furnace in an ambience of hydrogen gas at a pressure ranging from $0.0133×10^5$ Pa to $1.013×10^5$ Pa and at a temperature ranging from 800° C. to 1,000° C.

According to another aspect of the present invention, there is provided a method for manufacturing a semiconductor wafer having an epitaxial layer on a surface thereof, said method comprising the steps of forming a protective oxide film on a surface of a semiconductor wafer prior to loading of said wafer into an eptaxial growth furnace, removing said oxide film formed on said surface of said wafer by heating after said wafer is loaded in said furnace, and performing epitaxial growth of said epitaxial layer on said surface from which said oxide film is removed in said furnace wherein said step forming said protective oxide film comprises forming a silicon dioxide film on said surface of the wafer by using a solution of oxidizing agent, and wherein said step of removing said oxide film comprises heating said wafer within said furnace at a pressure of $5 \times 10^{-6}$ Pa or under and at a temperature ranging from 800° C. to 1,000° C.

As the result of various studies made by the inventors, the present invention has stemmed, as will be described later, from the discovery that by performing a heating operation at a relatively low temperature ranging from 800° C. to 1,000° C. for an epitaxial growth furnace for a given time in the furnace under a specified pressure environment, it is possible to remove the protective oxide film on a wafer without the occurrence of surface roughness and obtain a highly cleaned surface without contamination.

In accordance with the present invention, there is no need to provide any additional gas line for HCI etching purposes and consider the problem of corrosion of the equipment by HCI as in the case of the conventional method and the burden for equipment designing is decreased correspondingly.

In accordance with the present invention the term specified pressure environment can be typically represented by an ambience of hydrogen gas at a pressure ranging from $0.0133 \times 10^5$ Pa to $1.013 \times 10^5$ Pa. By performing a heating operation at a temperature within a range from 800° C. to 1,000° C. for a given time under this environment, the protective oxide film on the wafer surface can be removed satisfactorily without any contamination. For instance, where the protective oxide film of about 0.7 nm is heated at 950° C. under this pressure environment, it can be removed completely in a short time of 2 minutes.

This environment can be easily obtained by heating the interior of an epitaxial growth furnace up to a temperature within the above-mentioned temperature range by an ordinary heater equipped on the furnace and utilizing a line for hydrogen gas which is generally used as a standard gas for epitaxial growth while adjusting the furnace pressure to a pressure within the abovementioned pressure range through a pressure control system.

In this case, the oxide film is removed through the etching reaction of $SiO_2$ with $H_2$ and its etching properties are not so strong as in the case of the conventional HCI gas, thus making the problem of surface roughness less serious.

By removing the oxide film in the ambience of hydrogen gas, the oxide film can be completely removed by virtue of the satisfactory setting of temperature, pressure and processing time and the processing can be rapidly proceeded to the epitaxial growth process after the removal of the oxide film. Therefore, the use of the protective oxide film and the film removing step according to the present invention can be advantageously employed to the wafer handling in the semiconductor wafer manufacturing operation using a low temperature epitaxial growth.

It is to be noted that any attempt to considerably increase the furnace pressure of the hydrogen atmosphere in the oxide film removing step over $1.013 \times 10^5$ Pa or the normal pressures is not preferable since it requires that the feed gas must be fed into the furnace at a higher pressure with the resulting increase in the burden relating to the gas feed system and the epitaxial growth furnace. Also, if it is attempted to lower the pressure below $0.0133 \times 10^5$ Pa, the pressure can not be decreased easily and this is not preferable from the industrial production point of view.

Further, by performing a heating operation at a temperature within a range from 800° C. to 1,000° C. for a given period of time under another specified pressure environment or a so-called high vacuum environment equal to or lower than $5 \times 10^{-6}$ Pa, the protective oxide film on the wafer surface can be satisfactorily removed without contamination. For instance, a heating operation performed at 1,000° C. on the protective oxide film of 1.0 nm can completely remove it in 15 minutes. Such environment can be realized by a simple manner in which the interior of the epitaxial growth furnace is heated to a temperature within the above-mentioned temperature range by the heater usually equipped on the furnace and the pressure is decreased through the pressure control system.

By removing the oxide film in a high vacuum, differing from the one effected by HCI etching, there are the advantages that the problem of surface roughness can be completely eliminated and that after the removal of the oxide film, the replacement of the furnace atmosphere is simplified and the processing can be rapidly advanced to the low temperature epitaxial growth process. Therefore, the use of the protective oxide film and the film removing step according to the present invention can also be advantageously employed to the wafer handling in the semiconductor wafer manufacturing operation using a low temperature epitaxial growth.

It is to be noted that if the furnace pressure in the oxide film removing process is increased in excess of $5 \times 10^{-6}$ Pa, it is not preferable since the oxide film removing rate is decreased considerably.

Also, in either of the case of hydrogen atmosphere and the case of high vacuum condition, if the thickness of the protective oxide film exceeds a predetermined film thickness, it is not desirable since the removing rate is decreased considerably and the complete removing is made difficult. The predetermined film thickness is 5 nm or less for silicon dioxide ($SiO_2$) film. If the film thickness exceeds 5 nm, the complete removing becomes essentially difficult.

In the present invention the protective oxide film can be formed by supplying the ordinary oxidizing agent, e.g., ozone solution or solution of oxidizing agent such as aqueous solution of perammonia, aqueous solution of perhydrochloric acid or aqueous solution of persulfuric acid to the wafer surface and performing an oxidation treatment. By controlling the time of supply of such oxidizing agent to the wafer surface or the time of oxidation treatment, it is possible to obtain the previously mentioned desired oxide film thickness, e.g., a silicon dioxide film of 5 nm or less.

As a method for forming a protective oxide film composed of a silicon dioxide film having a film thickness of 5 nm or less, a process may for example be used which performs the oxidation treatment by immersing the wafer surface in an ozone water having an ozone concentration within the range form 4 ppm to 7 ppm for a period of time in the range between 1 minute and 8 minutes. Also, the oxide film can be formed in 10 to 20 seconds by a process which supplies a megahertz irradiated ozone water to the surface of a rotating wafer through the use of a spin cleaner.

Particularly, an aqueous solution of ozone is a simple and desirable oxidizing agent for use in the oxide film forming process since the decomposition rate of ozone is high so that not only the problem of environmental contamination by liquid chemicals is made less serious and the possibility of causing any chemical contamination is reduced than in the case of other liquid chemicals, but also there is no need for a heating condition of 80° C. to 100° C. during the oxidation treatment and the oxidation treatment can be performed at the normal temperature.

It is to be noted that the reason for the easy removal of the protective oxide film by heating according to the method of the present invention resides in the fact that the protective film used is comprised of an oxide film formed forcibly with only a pure $SiO_2$ in contrast to a natural or native oxide film formed while internally introducing contaminants. Thus, the use of the protective oxide film which is easily removable by the method of the present invention is not limited to the prevention of contamination prior to the epitaxial growth process and it is applicable to the prevention of contamination of the wafer surfaces at various stages, e.g., during the transfer of the wafers between the processing steps and their storage in the semiconductor wafer manufacturing process.

However, the use of such protective oxide film is increased in effectiveness from the contamination preventive point of view in proportion to the degree of cleanness of the wafer surface to be protected and therefore it is preferable to form such protective oxide film on the highly cleaned wafer surface after the final cleaning following the final polishing in the semiconductor wafer processing steps. Immediately after the formation of the protective oxide film or after the wafer has been stored for a given time in a cassette or the like, the wafer is loaded in the epitaxial growth furnace so that the formation of an epitaxial growth film is performed after the protective oxide film removing step in the furnace.

BRIEF DESCRIPTION OF DRAWINGS

FIGS. 2a and 2b show spectral diagrams showing the results of analysis by an XPS instrument of the semiconductor wafer surface in the processing steps of FIG. 1, in which FIG. 2a shows the spectral intensities of the $O_{1S}$ analyzed immediately after the final cleaning process, and FIG. 2b shows the intensities of the $O_{1S}$ analyzed immediately after the protective oxide film formation.

BEST MODE FOR CARRYING OUT THE INVENTION

Embodiment 1

Figure 1:
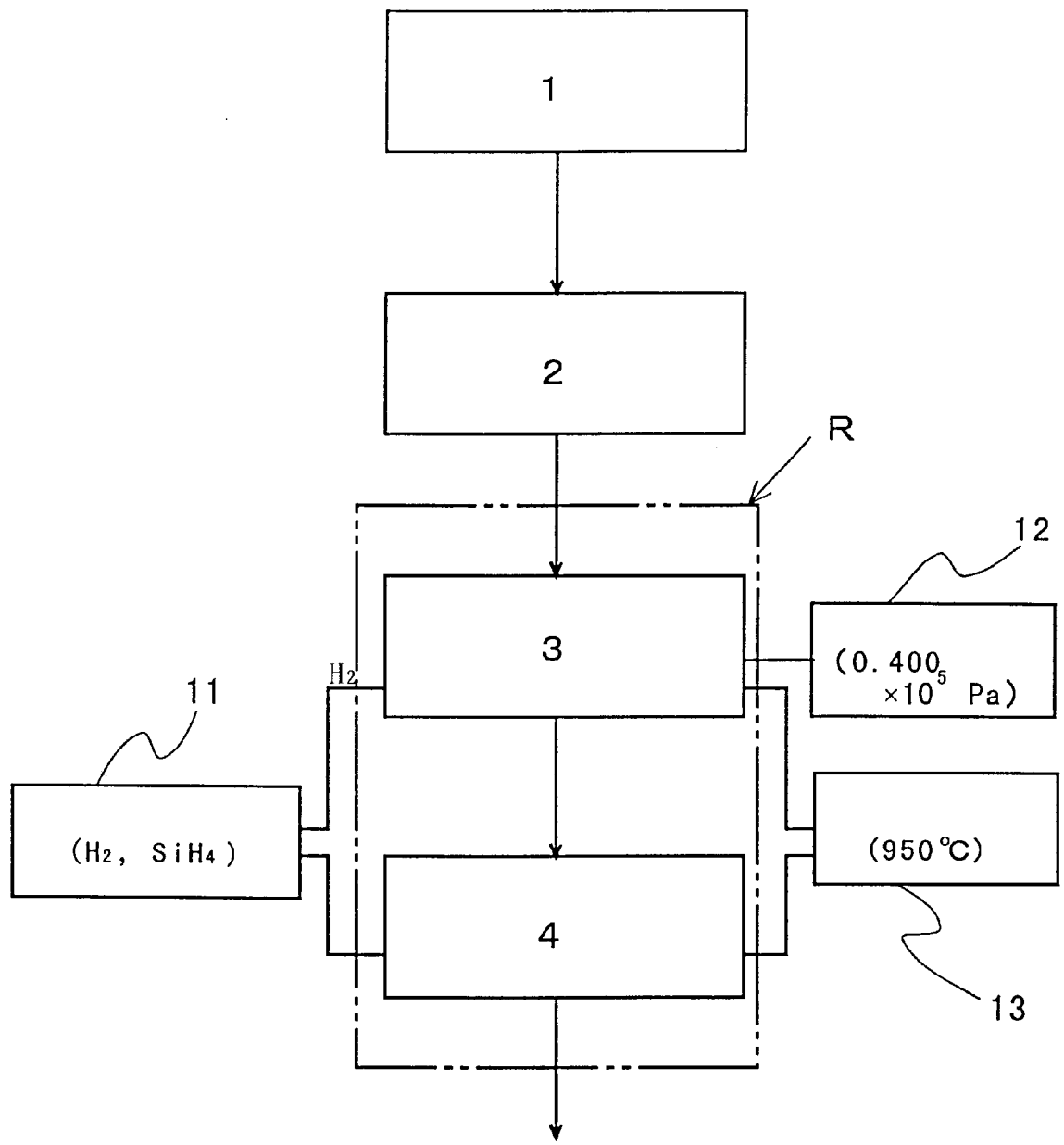
FIG. 1 is a flow chart showing schematically a sequence of processing steps for semiconductor wafer manufacture in the case where the removal of a protective oxide film is effected in an ambience of hydrogen gas.

Step of Forming Protective Oxide Film on Wafer Surface and Step of Removing it in Ambience of Hydrogen Gas The semiconductor wafer manufacturing method according to the present embodiment comprises forming a protective oxide film on the wafer surface outside an epitaxial growth furnace prior to an epitaxial growth step and removing the oxide film by heating in the epitaxial growth furnace in an ambience of hydrogen gas. FIG. 1 is a flow chart showing schematically these processing steps. It is to be noted that in this embodiment an ultrapure water having clean ozone addition is used as an oxidizing agent for the purposes of the formation of the protective oxide film.

After the final polishing, the surface of a semiconductor wafer is subjected to a high-degree cleaning by a final cleaning process (step 1) using the ozone-containing ultrapure water and DHF (dilute HF) and drying, and then an oxidation treatment is performed by immersing the wafer surface for 5 minutes in an aqueous solution of ozone having the ozone concentration adjusted to about 7 ppm at normal temperature thus forming a protective oxide film of about 0.7 nm in thickness (step 2).

The formation of the protective oxide film on the wafer surface was confirmed with the analysis (Alkα rays, 10 kV, 30 mA, X-ray incident angle: 1° or 5°) using an XPS (X-ray photoemission spectroscopy) instrument.

Figure 2A:
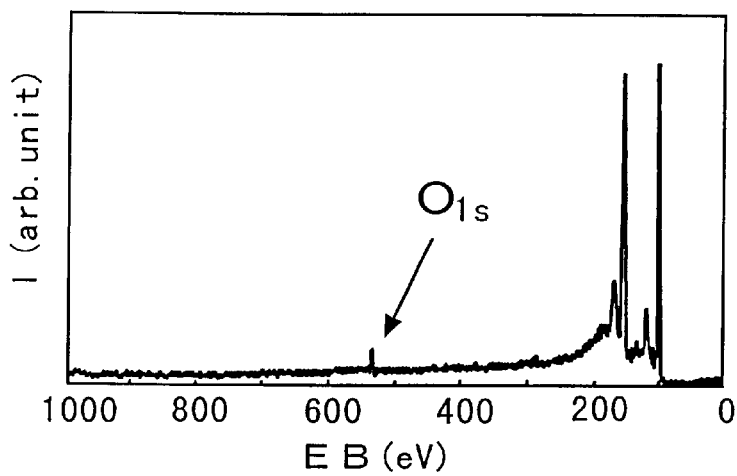
Figure 2B:
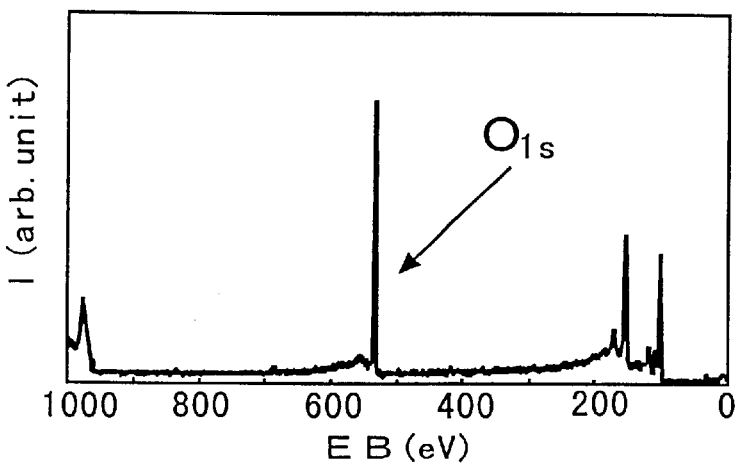
Figure 3:
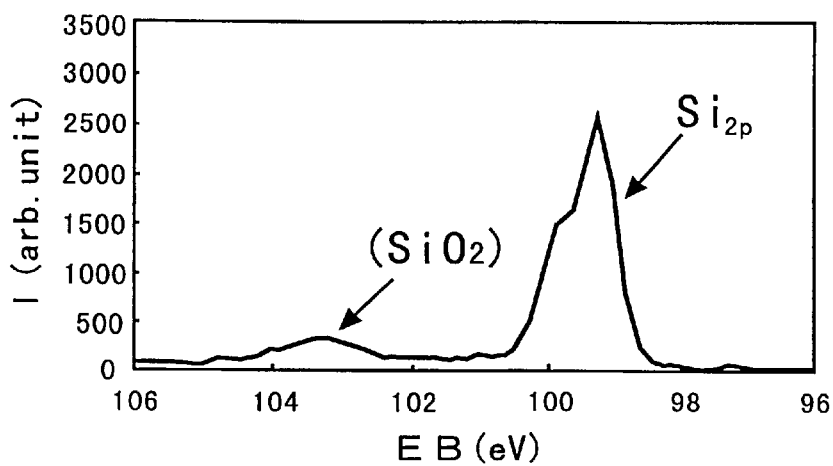
FIG. 3 is a spectral diagram showing the spectral intensities of the $Si_{2P}$ and $SiO_2$ resulting from the analysis by the XPS instrument of the semiconductor wafer surface immediately after the protective oxide film formation.

FIGS. 2a and 2b show the spectral intensity I (arb. unit) of $O_{1S}$ analyzed by the XPS instrument in relation to the bound energy EB (eV) on the abscissa. FIG. 2a shows the results of the analysis made immediately after the cleaning with the ozone-containing ultrapure water and DHF, and FIG. 2b shows the results of the analysis made immediately following the formation of the protective oxide film. On the other hand, FIG. 3 shows the spectral intensities I (arb.unit) of $Si_{2P}$ and $SiO_2$ analyzed immediately after the formation of the protective oxide film in relation to the bound energy EB (eV) on the abscissa. In either of these cases, the peak appears immediately after the oxide film formation.

In this way, the semiconductor wafer formed with the protective oxide film thereon is dried in a clean air and then it is loaded in a CVD epitaxial growth furnace R immediately thereafter or after it has been stored in a clean atmosphere for a given time, thereby performing an oxide film removing step (step 3) in the furnace.

Figure 4:
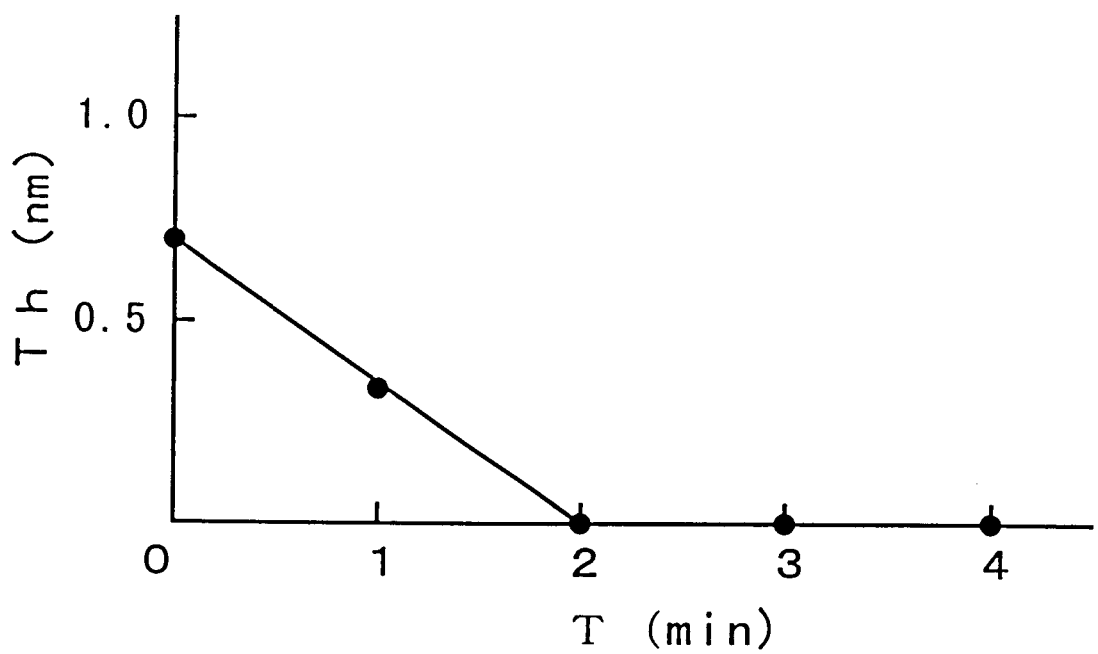
FIG. 4 is a graph showing in time sequence the process of removal (decrease) of the oxide film in the protective oxide film removing step of FIG. 1.

After the semiconductor wafer has been set in place in the furnace R. the furnace R is closed and the furnace is subjected to hydrogen purging to produce a hydrogen atmosphere therein by furnace atmosphere preparation means 11 while adjusting the furnace pressure to $0.400 \times 10^5$ Pa by furnace pressure adjusting means 12; then the furnace temperature is raised to 950° C. by furnace temperature adjusting means 13 and the removal of the oxide film by heating is started. After this heating operation, an analysis (Alkα ray, 10 kV, 30 mA, X-ray incident angle: 1° or 5°) is also made by an XPS instrument connected to the epitaxial growth furnace R. The thickness of the oxide film are determined from the results of the analysis and the change with time of the oxide film thickness or the process of the oxide film removal is shown in terms of the relation between the heating time T (min) on the abscissa and the oxide film thickness Th (nm) on the ordinate in the graph of FIG. 4.

Figure 5:
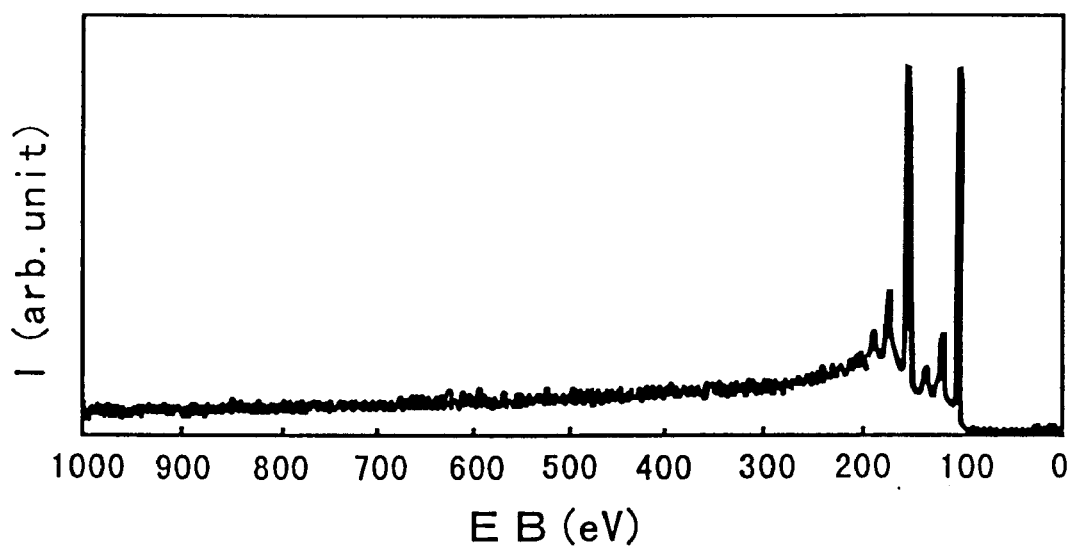
FIG. 5 is a spectral diagram showing the spectral intensities of the $O_{1S}$ resulting from the analysis by the XPS instrument of the semiconductor wafer surface immediately after the protective oxide film removing step in FIG. 1.
Figure 6:
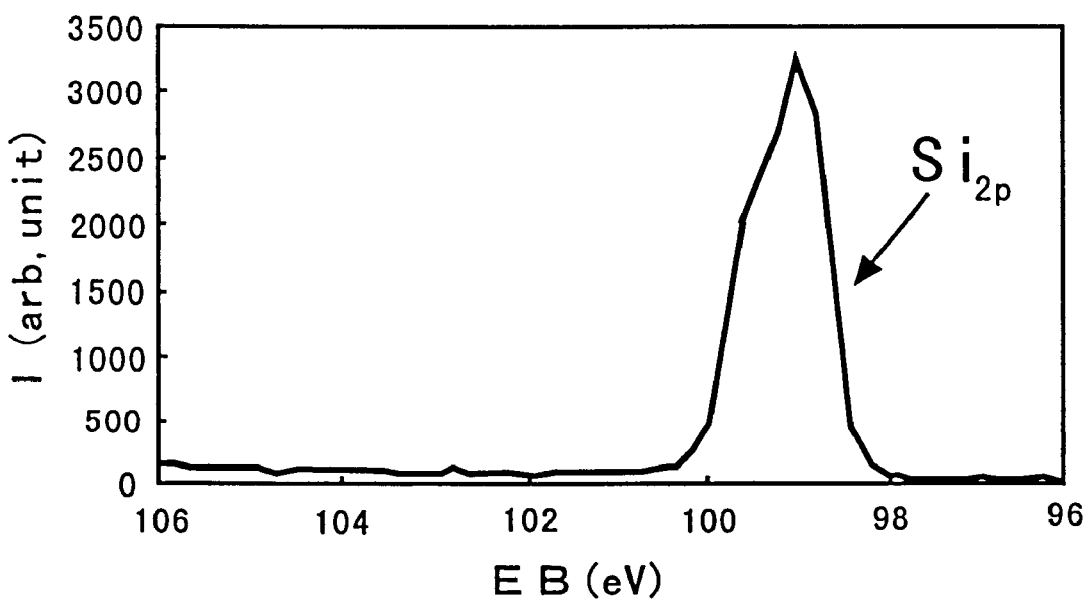
FIG. 6 is a spectral diagram showing the spectral intensities of the $Si_{2P}$ and $SiO_2$ resulting from the analysis by the XPS instrument of the semiconductor wafer surface immediately after the protective oxide film removing step in FIG. 1.

As will be apparent from these results, the oxide film is decreased and removed substantially linearly and the protective oxide film on the wafer surface is completely removed in 2 minutes. The semiconductor wafer surface subjected to the above-mentioned heating operation for 2 minutes was analyzed by the XPS instrument. FIG. 5 shows the spectral intensity I (arb. unit) of $O_{1S}$ on the ordinate in relation to the bound energy EB (eV) on the abscissa, and FIG. 6 shows the spectral intensities I (arb unit) of $Si_{2P}$ and $SiO_2$ on the ordinate in relation to the bound energy EB (eV) on the abscissa. The spectral peak of the $O_{1S}$ appearing in FIG. 2(b) and the spectral peak of the $SiO_2$ appearing in FIG. 3 are both eliminated completely.

Since any decreasing coefficient of an oxide film under given conditions of furnace pressure, temperature, etc., can be easily obtained, it is possible to control the heating time in relation to the film thickness on the basis of a predetermined decreasing coefficient thereby avoiding any unnecessary heating and improving the operating efficiency. Of course, use may be made of a method of continuing the heating operation until the complete removal of the oxide film is confirmed while measuring the remaining oxide film thickness during the oxide film removing process.

After the removal of the oxide film, while allowing the furnace pressure to remain at $0.400 \times 10^5$ Pa which is the same as the pressure condition for the oxide film removing step and also maintaining the furnace temperature at about 950° C., a monosilane gas is circulated in the furnace and supplied onto the wafer surface by the furnace atmosphere preparation means 11 and epitaxial growth is started (step 4). This results in the formation of a high-quality grown layer which is free of any crystal defect.

With these processing steps, there is no large difference in furnace temperature condition between the oxide film removing step and the epitaxial growth step and also the hydrogen atmosphere is present in the furnace; thus, less time and labor are required for the furnace purging and the transfer between the processing steps is facilitated thereby making the whole processes efficient.

While the removal of the protective oxide film in this process, effected in the hydrogen atmosphere of $0.400 \times 10^5$ Pa at 950° C., is completed in 2 minutes, comparison was made among the cases where the removing operation of oxide film was performed under different furnace temperature and pressure conditions. Firstly, measurements were made of the times required for the removal of a protective oxide film having a thickness of about 7 nm at the respective pressures of $0.400 \times 10^5$ Pa (black circle:●) which was the same as the present processing, $0.800 \times 10^5$ Pa (black triangle:▲) and $1.013 \times 10^5$ Pa (white square: □) and at temperatures in the range between 900° C. and 950° C. in contrast to the heating operation on a semiconductor wafer which was cleaned but formed with no protective oxide film (white diamond: ◇).

Figure 7:
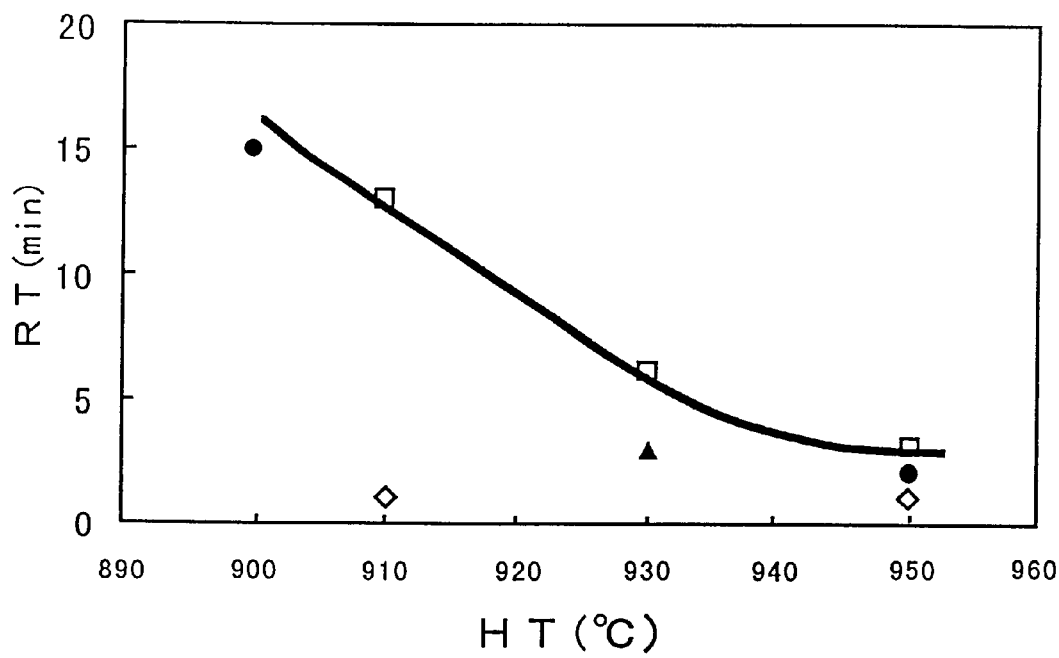
FIG. 7 is a graph showing the measurement results of the times required for the complete removal of the protective oxide film in the ambience of hydrogen gas at different pressures and at different temperatures.

The results are shown in the graph of FIG. 7 showing the oxide film removing time RT (min) on the ordinate in relation to the heating time HT (° C.) on the abscissa. The time required for the removal of a protective oxide film is increased with decrease in the heating temperature so that as mentioned previously, the removal of a protective oxide film is completed in 2 minutes in an ambience of hydrogen gas of $0.400 \times 10^5$ Pa at 950° C. and the required time is 15 minutes in the case of an ambience of hydrogen gas of $0.400 \times 10^5$ Pa at 900° C. On the other hand, the pressure conditions are in the range between $0.400 \times 10^5$ Pa and $0.800 \times 10^5$ Pa thus showing practically no great difference.

It follows from these results that the shortest condition does not necessarily take precedence for the heating time in the oxide film removing step so that if, for example, the furnace processing temperature is to be set to a relatively low value, it is only necessary to suitably set the processing time correspondingly.

Figure 8:
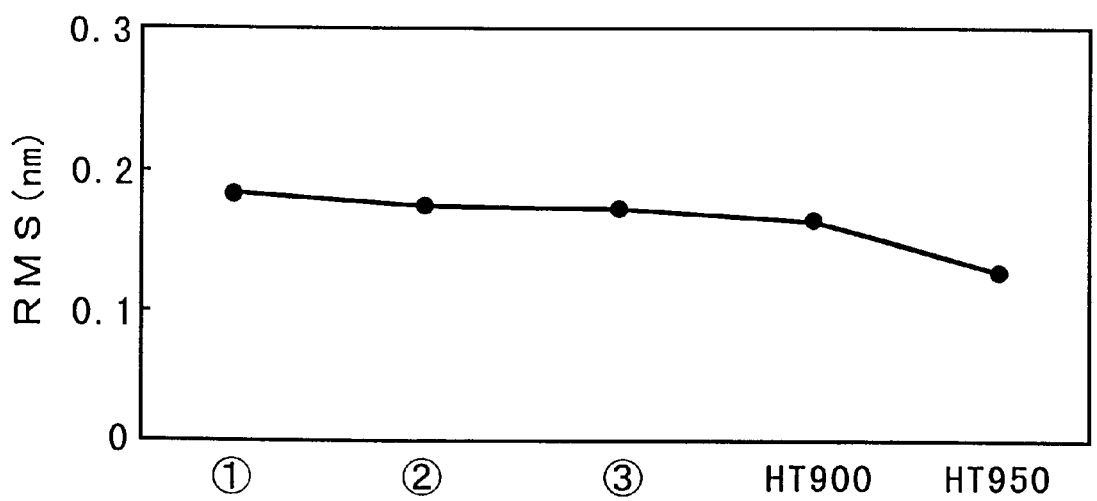
FIG. 8 is a graph showing the variations of the surface roughness (RMS value) of the semiconductor wafer at the respective stages in the processing steps of FIG. 1.

Also, with a view to examining the effect of heating in hydrogen on the surface of semiconductor wafers, the surface roughness (nm; RMS value) of the semiconductor wafers were measured by an atomic force microscope (AFM). FIG. 8 shows a comparison among the measured values of. the wafer surface immediately after the completion of the final polishing (①); the wafer surface immediately after the final cleaning (②); the wafer surface immediately after the formation of the protective oxide film (③); the wafer surface immediately after the 15-minute removal of the protective oxide film in an ambience of hydrogen gas at $0.400 \times 10^5$ Pa and at 900° C. (HT 900); and the wafer surface immediately after the 2-minute removal of the protective oxide film in an ambience of hydrogen gas at $0.400 \times 10^5$ Pa and at 950° C. (HT 950). As will be seen from FIG. 8 which shows the results in the RMS values at the respective stages, there is seen no deterioration in the RMS values due to the heating in the hydrogen atmosphere.

Thus, it is apparent that the surface of the semiconductor wafer after the removal of the protective oxide film by the heating operation in the ambience of hydrogen gas is a highly clean surface free of surface roughness from which the protective oxide film has been completely removed by this removing operation along with the contaminants e.g., organic matters deposited on the oxide film during the loading of the semiconductor wafer in the furnace.

Embodiment 2

Figure 9:
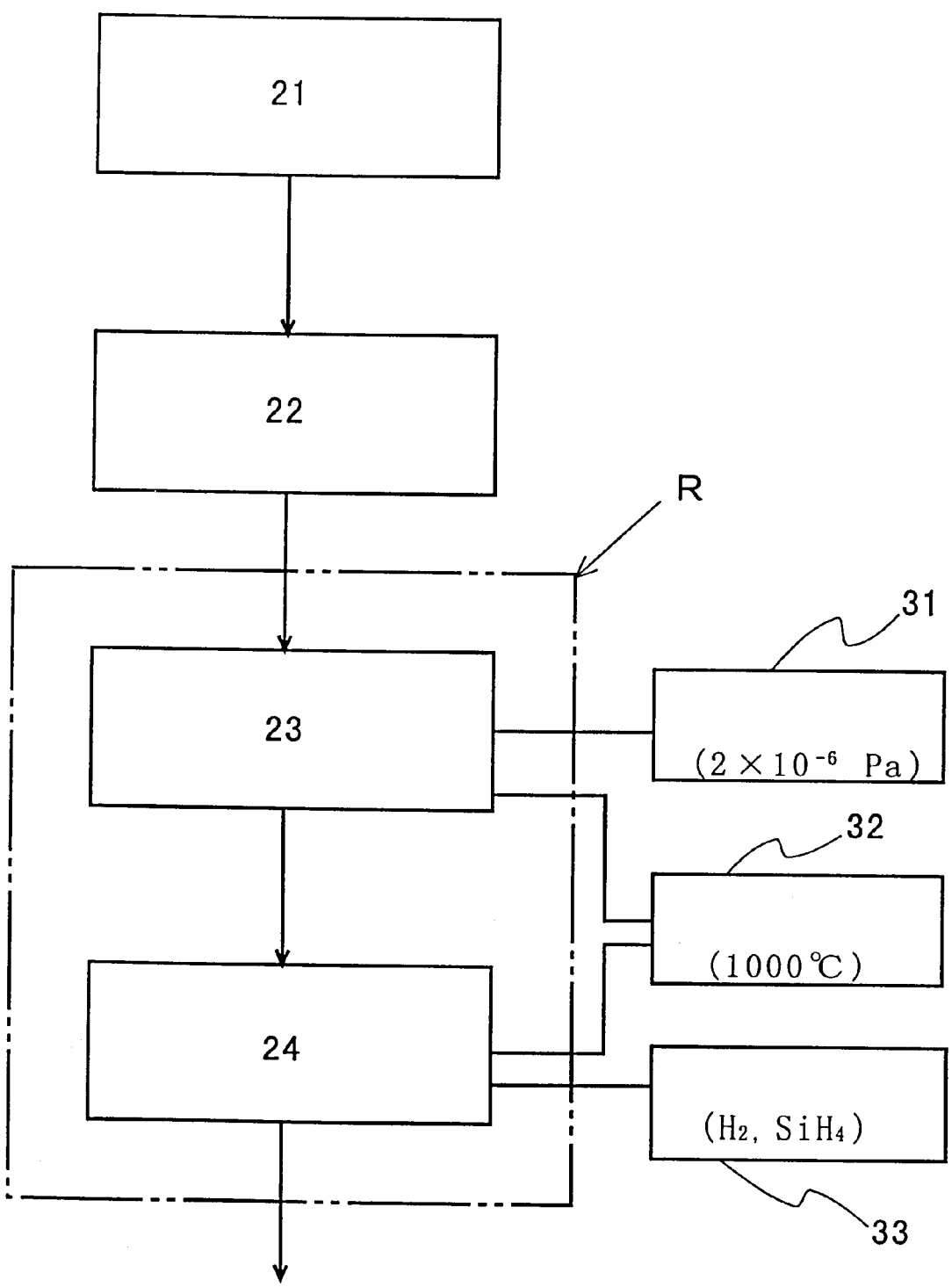
FIG. 9 is a flow chart showing schematically a sequence of processing steps for semiconductor wafer manufacture in the case where the removal of a protective oxide film is effected in a given high vacuum condition.

Step of Forming Protective Oxide Film on Wafer Surface and its Removing Step in High Vacuum A semiconductor wafer manufacturing method according to this embodiment comprises forming a protective oxide film on the wafer surface outside an epitaxial growth furnace prior to an epitaxial growth process, and removing the oxide film by heating in a high vacuum in the epitaxial growth furnace. FIG. 9 is a flow chart showing schematically these processing steps. It is to be noted that in this embodiment an ultrapure water with the addition of clean ozone is used as an oxidizing agent for the purposes of the formation of the protective oxide film.

Firstly, a semiconductor wafer subjected to a final polishing is subjected to a final cleaning process (step 21) using an ozone-containing ultrapure water and DHF (dilute HF) to obtain a highly cleaned surface and then dried; immediately thereafter the surface of the semiconductor wafer is subjected to an oxidation treatment for 5 minutes by immersing its surface in an aqueous solution of ozone adjusted to an ozone density of about 7 ppm at the normal temperature thereby forming a protective oxide film of about 0.7 nm in film thickness (confirmed by the analysis of an XPS instrument) (step 22). The semiconductor wafer formed with the protective oxide film is dried in a clean air and then, after it has been stored in a clean atmosphere for a given time or immediately thereafter, the semiconductor wafer is loaded in a CVD epitaxial growth furnace R thereby performing an oxide film removing process in the furnace (step 23).

After the semiconductor wafer has been set in place in the furnace R, the furnace R is closed and the pressure is decreased to adjust it to $2 \times 10^{-6}$ Pa by furnace pressure adjusting means 31; then, the furnace temperature is raised to about 1,000° C. by furnace temperature adjusting means 32 thereby starting the removing of the oxide film by heating. The protective oxide film is completely removed by heating for 15 minutes. At this time, the contaminants, e.g., organic matters deposited on the protective oxide film during the loading of the semiconductor wafer in the furnace are simultaneously removed and a surface which is highly clean and also free of surface roughness is produced. This complete removal of the oxide film on the wafer surface was confirmed by the analysis of the XPS instrument connected to the epitaxial growth furnace R.

After the oxide film has been removed, hydrogen gas is fed into the furnace by furnace atmosphere preparation means 33 to purge the furnace and then monosilane gas is fed onto the wafer surface by circulating it within the furnace, thereby starting epitaxial growth (step 33). As a result, a high-quality grown film is produced which involves no deterioration of the RMS and is free of any crystal defect, i.e., having the transition range of less than 0.2 µm for the distribution of the dopant impurities (boron in this embodiment) produced at the boundary surface between the epitaxial growth layer and the substrate.

With the foregoing processing steps, practically the same furnace temperature condition is used for both the oxide film removing step and the epitaxial growth step so that the transfer of the processing between the steps is facilitated and also there is no use of any gas, e.g., HCI gas which is not used for epitaxial growth with the resulting elimination of the corresponding labor for furnace purging and improvement in the efficiency of the processing steps on the whole.

It is to be noted that the foregoing heating time for the oxide film removing step in high vacuum is not limited to that shown in the present embodiment and it is only necessary to suitably set to one within a given range in correspondence to the selected furnace pressure and furnace temperature.

Further, while the foregoing first and second embodiments have been described only in connection with the protective oxide film formed by use of ozone solution, it is of course possible to form a protective oxide film by using any other oxidizing agent, e.g., aqueous solution of perammonia, aqueous solution of perhydrochloric acid or aqueous solution of persulfuric acid and in this case it is preferable that the oxidizing agent used has less tendency toward causing such problem as contamination by liquid chemicals.

What is claimed is:

1. A method for manufacturing a semiconductor wafer having an epitaxial layer on a surface thereof, comprising the steps of:

forming a protective oxide film on a surface of a semiconductor wafer prior to loading of said wafer into an epitaxial growth furnace;

removing said oxide film formed on said surface of said wafer by heating after said wafer is loaded in said furnace; and performing epitaxial growth of said epitaxial layer on said surface from which said oxide film is removed in said furnace, wherein said step of forming said protective oxide film comprises forming a silicon dioxide film on said surface of said wafer by using a solution of oxidizing agent, and wherein said step of removing said oxide film comprises heating said wafer in an ambience of hydrogen gas at a pressure ranging from $0.0133 \times 10^5$ Pa to $1.013 \times 10^5$ Pa and at a temperature ranging from 800° C. to 1,000° C.

2. The method according to claim 1, wherein step of forming said silicon dioxide film comprises supplying ozone water to said surface of said wafer for a predetermined period of time, and forming said silicon dioxide film to a thickness equal to or less than 5 nm.

3. A method for manufacturing a semiconductor wafer having an epitaxial layer on a surface thereof, comprising the steps of:

forming a protective oxide film on a surface of a semiconductor wafer prior to loading of said wafer into an epitaxial growth furnace;

removing said oxide film formed on said surface of said wafer by heating after said wafer is loaded in said furnace; and performing epitaxial growth of said epitaxial layer on said surface from which said oxide film is removed in said furnace, wherein said step of forming said protective oxide film comprises forming a silicon dioxide film on said surface of said wafer by using a solution of oxidizing agent, and wherein said step of removing said oxide film comprises heating said wafer in said furnace at a pressure of $5 \times 10^{-6}$ Pa or under and at a temperature ranging from 800° C. to 1,000° C.

4. The method according to claim 3, wherein step of forming said silicon dioxide film comprises supplying ozone water to said surface of said wafer for a predetermined period of time, and forming said, silicon dioxide film to a thickness equal to or less than 5 nm.

* * * * *